United States Patent
Jau et al.

(10) Patent No.: US 9,030,827 B2
(45) Date of Patent: May 12, 2015

(54) SERVER AND DRAWER LIFTING DEVICE

(71) Applicant: Quanta Computer Inc., Taoyuan Shien (TW)

(72) Inventors: Maw-Zan Jau, Taipei (TW);
Chao-Jung Chen, New Taipei (TW);
Yaw-Tzorng Tsorng, Taipei (TW);
Chung-Hua Jen, Bade (TW)

(73) Assignee: Quanta Computer Inc., Taoyuan Shien (TW)

( * ) Notice: Subject to any disclaimer, the term of this patent is extended or adjusted under 35 U.S.C. 154(b) by 130 days.

(21) Appl. No.: 13/775,879

(22) Filed: Feb. 25, 2013

(65) Prior Publication Data

US 2014/0036434 A1 Feb. 6, 2014

(30) Foreign Application Priority Data

Aug. 6, 2012 (TW) .............................. 101128315 A

(51) Int. Cl.
G06F 1/16 (2006.01)
A47B 51/00 (2006.01)
H05K 7/14 (2006.01)
G06F 1/18 (2006.01)

(52) U.S. Cl.
CPC . *G06F 1/16* (2013.01); *A47B 51/00* (2013.01); *H05K 7/1487* (2013.01); *G06F 1/187* (2013.01)

(58) Field of Classification Search
USPC ......... 312/223.2, 223.6, 330.1; 361/724–732; 211/59.3, 26, 49.1
See application file for complete search history.

(56) References Cited

U.S. PATENT DOCUMENTS

| | | | | | |
|---|---|---|---|---|---|
| 3,862,788 | A | * | 1/1975 | Hock et al. | 312/294 |
| 4,351,592 | A | * | 9/1982 | Link et al. | 353/72 |
| 5,058,090 | A | * | 10/1991 | Ueno et al. | 369/30.89 |
| 5,329,410 | A | * | 7/1994 | Iwamoto | 360/94 |
| 5,414,573 | A | * | 5/1995 | Koga et al. | 360/93 |
| 5,535,071 | A | * | 7/1996 | Yamagishi et al. | 360/96.51 |
| 5,587,877 | A | * | 12/1996 | Ryan et al. | 361/679.6 |
| 5,940,355 | A | * | 8/1999 | Buckland et al. | 369/30.55 |
| 7,068,498 | B2 | * | 6/2006 | Bolich et al. | 361/752 |
| 7,742,308 | B1 | * | 6/2010 | King et al. | 361/727 |
| 8,031,563 | B2 | * | 10/2011 | Iwata | 369/30.39 |
| 8,332,066 | B2 | * | 12/2012 | Weber | 700/242 |
| 8,424,983 | B1 | * | 4/2013 | Strauss et al. | 312/247 |
| 2002/0171334 | A1 | * | 11/2002 | Pinheiro | 312/223.1 |
| 2005/0063147 | A1 | * | 3/2005 | Yu | 361/683 |
| 2008/0315739 | A1 | * | 12/2008 | Hirano | 312/330.1 |
| 2009/0245743 | A1 | * | 10/2009 | Cote et al. | 385/135 |
| 2010/0198398 | A1 | * | 8/2010 | Yuyama et al. | 700/231 |
| 2011/0214942 | A1 | * | 9/2011 | Niemiec | 182/19 |
| 2011/0222234 | A1 | * | 9/2011 | Davis et al. | 361/679.33 |
| 2011/0280700 | A1 | * | 11/2011 | Uttech et al. | 414/540 |
| 2012/0248958 | A1 | * | 10/2012 | Ertz et al. | 312/405 |
| 2014/0145577 | A1 | * | 5/2014 | Zimmermann | 312/327 |

* cited by examiner

*Primary Examiner* — Hung S Bui
*Assistant Examiner* — Michael Matey
(74) *Attorney, Agent, or Firm* — Novak Druce Connolly Bove + Quigg LLP

(57) ABSTRACT

A server includes a casing, a bottom plate, a first hard disk module, a second hard disk module, and a lifting device. The bottom plate is disposed in the casing and configured to be sliding relative to the casing. The first hard disk module is movably disposed on the bottom plate. The first hard disk module includes a track. The second hard disk module is fixed on the bottom plate and disposed behind the first hard disk module. The lifting device moves up the first hard disk module when the bottom plate is pulled out of the casing, and the lifting device moves down the first hard disk module when the bottom plate is pushed into the casing. A drawer lifting device is also disclosed.

20 Claims, 10 Drawing Sheets

SERVER AND DRAWER LIFTING DEVICE

RELATED APPLICATIONS

This application claims priority to Taiwan Application Serial Number 101128315, filed Aug. 6, 2012, which is herein incorporated by reference.

BACKGROUND

1. Technical Field

The present disclosure relates to a drawer lifting device. More particularly, the present invention relates to a drawer lifting device applied to a server.

2. Description of Related Art

A general drawer device for providing an accommodating space is mainly composed of a movable bottom plate with an accommodating space in a casing or a frame. The drawer moves into and out of the casing through a track module disposed between the casing and the bottom plate.

The bad designs may happen to the conventional drawer devices in some special situations although the drawer device is widely used in various occasions; however, every now and then the design issues still can be seen, especially in the design with specific purposes of use. For example, if the drawer is configured not in a conveniently reachable range of the users, users have to adapt themselves to the position of the drawer and the goods kept in the drawer device are hard to be accessed under this circumstance.

The drawer devices are used in the conventional server for the purpose of accommodating the hard disk modules in the server. The user only needs to pull out the bottom plate loaded with the wanted hard disk module to replace a hard disk in the hard disk module as needed. However, since such replacement of the hard disk can only be conducted through the front of the server under the limitation the design, no hard disk modules are allowed to be disposed behind the hard disk module due to their infeasibility of the hard disk replacement, so as to limit the accommodating space of the server.

SUMMARY

An aspect of the present invention provides a server. The server includes a casing, a bottom plate, a first hard disk module, a second hard disk module, and a lifting device. The bottom plate is disposed in the casing and configured to be sliding relative to the casing. The first hard disk module is movably disposed on the bottom plate, and the first hard disk includes a track. The second hard disk module is fixed on the bottom plate and disposed behind the first hard disk module. The lifting device is for moving up and down the first hard disk module relative to the bottom plate, and the lifting device includes a first rack, a gear group, a second rack, a connector, and a shaft module. The first rack is fixed on the casing. The gear group is fixed on the second hard disk module and coupled to the first rack. The second rack is fixed on the bottom plate and coupled to the gear group. The connector is fixed on the second rack. The shaft module includes a first shaft and a second shaft. Two terminals of the first shaft are pivotally connected to the connector and the first hard disk module respectively, and two terminals of the second shaft are pivotally connected to the track and the bottom plate respectively. The first hard disk module is moved up by the lifting device when the bottom plate is pulled out of the casing, and the first hard disk module is moved down to the bottom plate by the lifting device when the bottom plate is pushed into the casing.

In one or more embodiments, the gear group optionally includes at least one gear, and the number of the gear is odd.

In one or more embodiments, the connector is optionally a pivot block.

In one or more embodiments, the first shaft and the second shaft are optionally disposed across, and a cross point of the first shaft and the second shaft is optionally a pivot point.

Another aspect of the present invention provides a drawer lifting device. The drawer lifting device includes a casing, a bottom plate, a box, and a lifting device. The bottom plate is disposed in the casing and utilized to be slid relative to the casing. The box is movably disposed on the bottom plate, and the box includes a track. The lifting device is for moving up and down the box relative to the bottom plate, and the lifting device includes a first rack, a gear group, a second rack, a connector, and a shaft module. The first rack is fixed on the casing. The gear group is fixed on the bottom plate and coupled to the first rack. The second rack is fixed on the bottom plate and coupled to the gear group. The connector is fixed on the second rack. The shaft module includes a first shaft and a second shaft. Two terminals of the first shaft are pivotally connected to the connector and the box respectively, and two terminals of the second shaft are pivotally connected to the track and the bottom plate respectively. The box is moved up by the lifting device when the bottom plate is pulled out of the casing, and the box is moved down to the bottom plate by the lifting device when the bottom plate is pushed into the casing.

In one or more embodiments, the gear group optionally includes at least one gear, and the number of the gear is odd.

In one or more embodiments, the connector is optionally a pivot block.

In one or more embodiments, the first shaft and the second shaft are optionally disposed across, and a cross point of the first shaft and the second shaft is optionally a pivot point.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
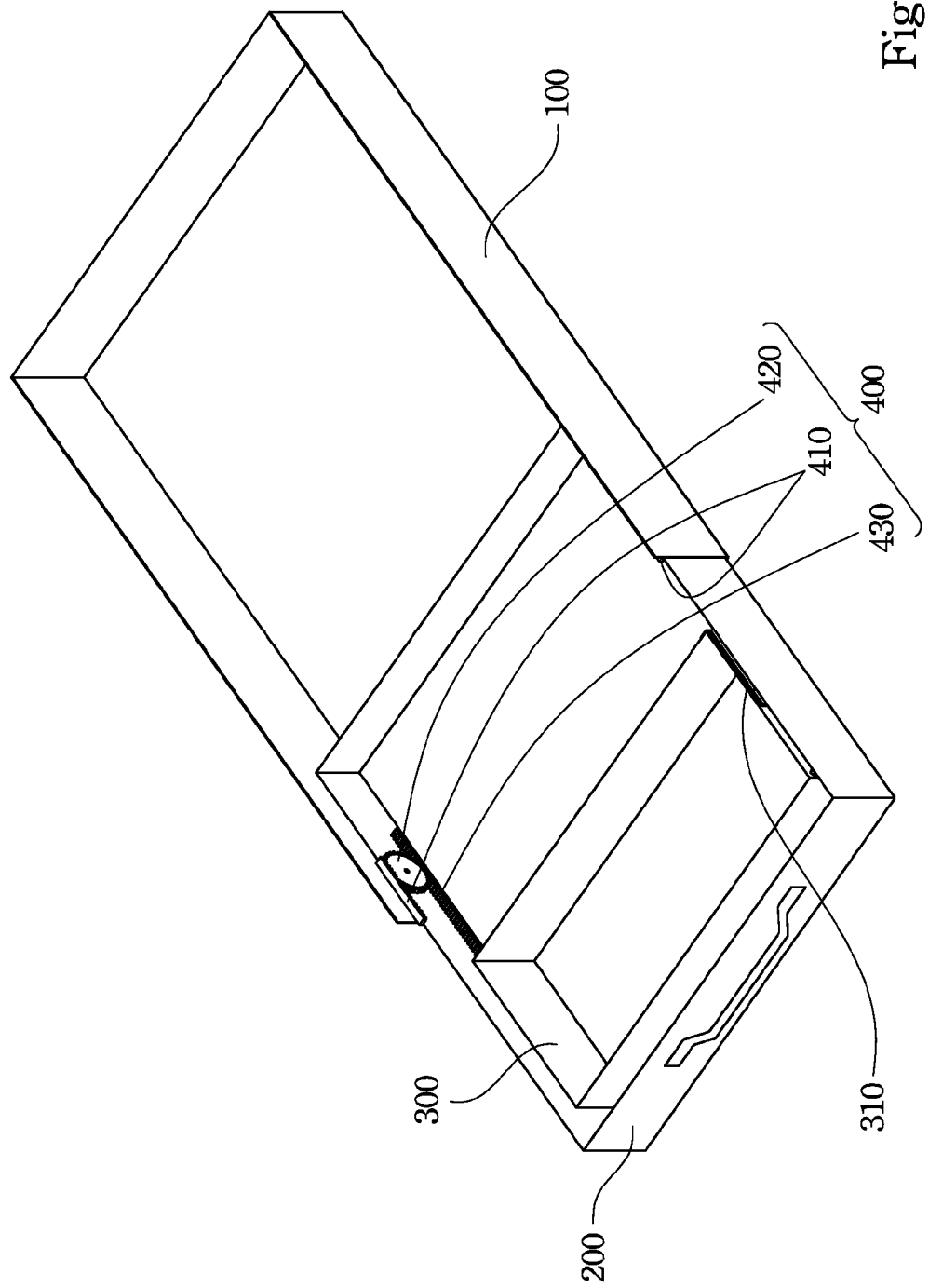
FIG. 1 is a schematic diagram of a drawer lifting device when the bottom plate is not moved out completely according to one embodiment of the present invention.
Figure 2:
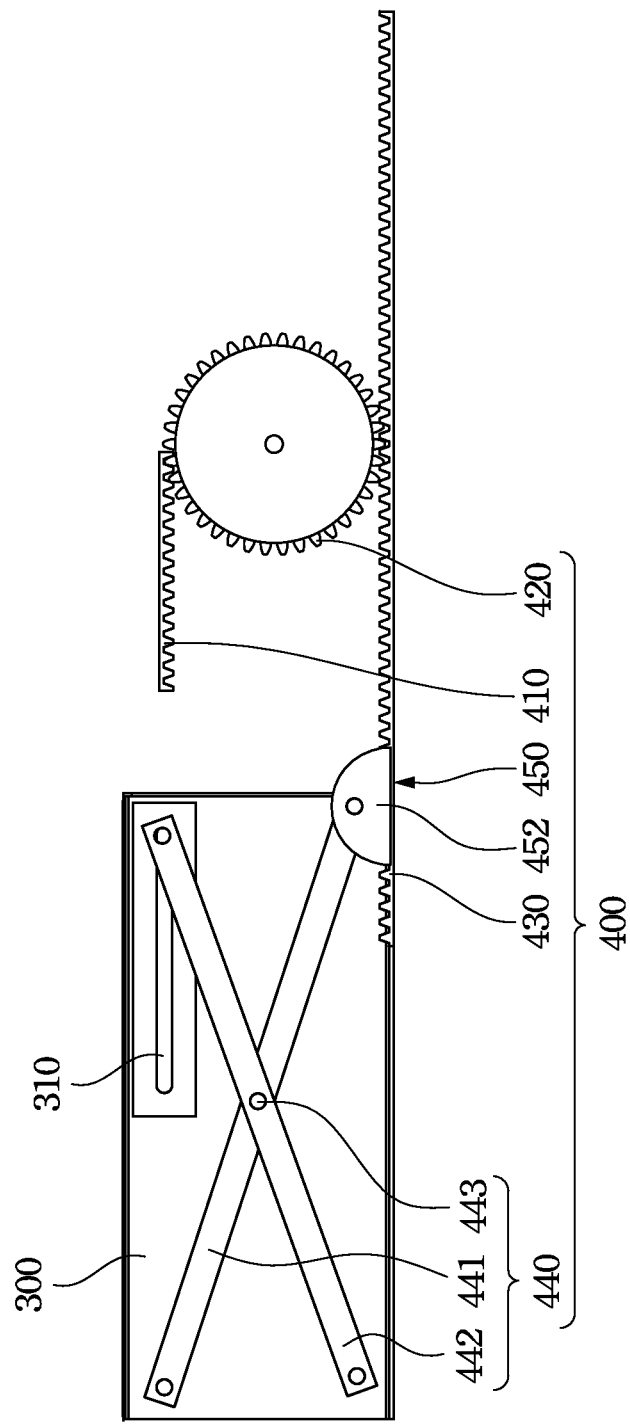
FIG. 2 is a side view of the lifting device and the box in FIG. 1.

FIG. 1 is a schematic diagram of a drawer lifting device when the bottom plate is not moved out completely according to one embodiment of the present invention. FIG. 2 is a side view of the lifting device 400 and the box 300 in FIG. 1. The drawer lifting device includes a casing 100, a bottom plate 200, a box 300, and a lifting device 400. The bottom plate 200 is disposed in the casing 100 and utilized to be slid relative to the casing 100. In other words, the bottom plate 200 may be moved into or out of the casing 100 through a handle. The box 300 includes a track 310. The box 300 is movably disposed on the bottom plate 200. That is, the box 300 is disposed on the bottom plate 200 when the bottom plate 200 is not pulled out of the casing 100, and the box 300 is moved relative to the bottom plate 200 when the bottom plate 200 is pulled out of the casing 100. The lifting device 400 is disposed in a side gap between the bottom plate 200 and the casing 100 for lifting the box 300 relative to the bottom plate 200 when the bottom plate 200 is moved into or out of the casing 100. In one or more embodiments, the number of the lifting device 400 may be one or plural. The person having ordinary skill in the art may design the number of the lifting device 400 according to actual requirements.

The lifting device 400 includes a first rack 410, a gear group 420, a second rack 430, a connector 450, and a shaft module 440. The first rack 410 is fixed on the casing 100. The gear group 420 is fixed on the bottom plate 200 and coupled to the first rack 410. In one or more embodiments, the gear number of the gear group 420 may be one. The second rack 430 is fixed on the bottom plate 200 and coupled to the gear group 420. The connector 450 is pivotally connected to the shaft module 440, and the connector 450 may be a pivot block 452. The pivot block 452 is fixed on the second rack 430 and moves horizontally when the second rack 430 moves (details are in following).

The shaft module 440 includes a first shaft 441 and a second shaft 442. The two terminals of the first shaft 441 are pivotally connected to the connector 450 and the box 300, respectively, and the two terminals of the second shaft 442 are pivotally connected to the track 310 and the bottom plate 200, respectively. The first shaft 441 and the second shaft 442 may be disposed across, and a cross point of the first shaft 441 and the second shaft 442 is a pivot point 443. It should be understood that the foregoing setup of the first shaft 441 and the second shaft 442 are only examples, and the present disclosure is not limited to the foregoing setup. The person having ordinary skill in the art may design the setup of the first shaft 441 and the second shaft 442 according to actual requirements.

Figure 3:
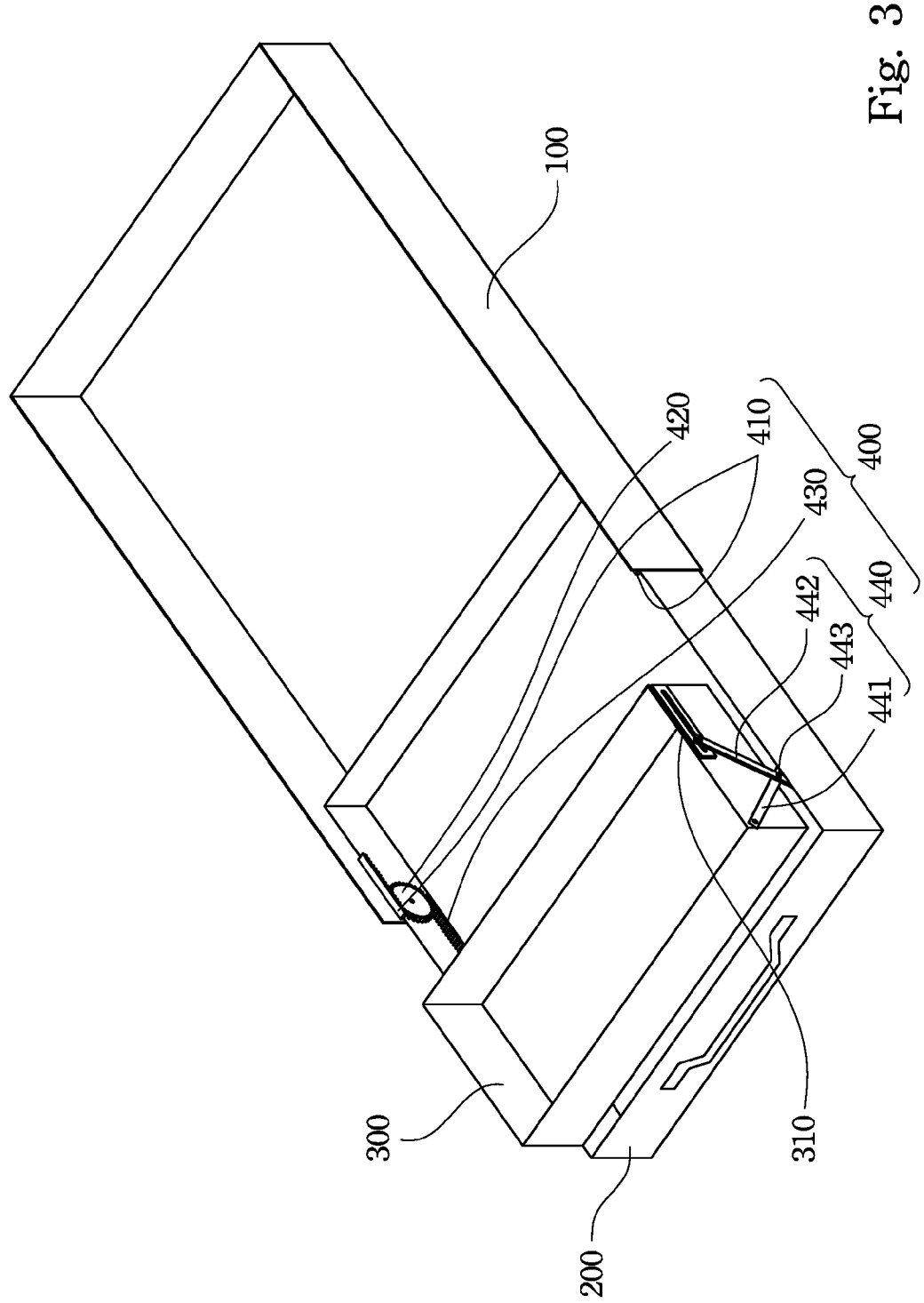
FIG. 3 is a schematic diagram of a drawer lifting device when the bottom plate is moved out completely according to one embodiment of the present invention.
Figure 4:
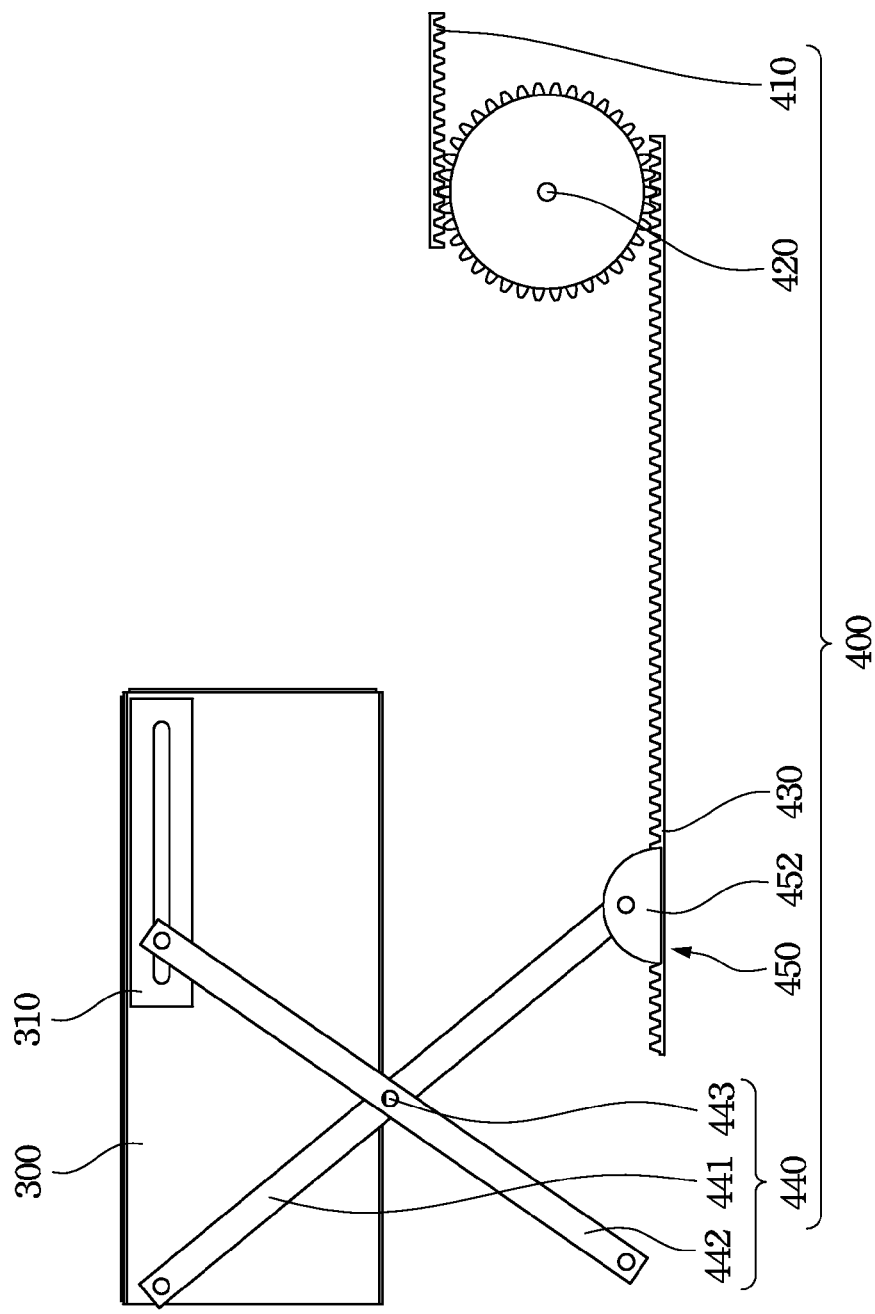
FIG. 4 is a side view of the lifting device and the box in FIG. 3.

FIG. 3 is a schematic diagram of a drawer lifting device when the bottom plate is moved out completely according to one embodiment of the present invention. FIG. 4 is a side view of the lifting device 400 and the box 300 in FIG. 3. When the bottom plate 200 is pulled out of the casing 100, the first rack 410 fixed in the casing 100 makes the gear group 420 rotate clockwise since the first rack 410 is coupled to the gear group 420 which is fixed on the bottom plate 200, and therefore the center of the gear group 420 moves toward the moving direction of the bottom plate 200 relative to the first rack 410. The gear group 420 rotating clockwise brings the second rack 430 coupled to the gear group 420 to move toward the moving direction of the bottom plate 200 relative to the bottom plate 200. The connector 450 fixed on the second rack 430 therefore moves toward the same direction as the second rack 430, and the box 300 is lifted by the shaft module 440.

The first shaft 441 is moved with the connector 450 when the connector 450 moves toward the moving direction of the bottom plate 200. Since the other terminal of the first shaft 441 is pivotally connected to the box 300, the first shaft 441 rotates clockwise around the connector 450 as a center. The rotating first shaft 441 brings the second shaft 442 through the pivot point 443, such that the second shaft 442 rotates counterclockwise around a terminal pivotally connected to the bottom plate 200 as a center. The second shaft 442 and a terminal pivotally connected to the track 310 therefore slide along the track 310, such that the box 300 is lifted by the shaft module 440.

In contrast, when the bottom plate 200 is pushed into the casing 100, the center of the gear group 420 moves toward the moving direction of the bottom plate 200 relative to the first rack 410, such that the gear group 420 rotates counterclockwise. The gear group 420 rotating counterclockwise brings the second rack 430 to move toward the moving direction of the bottom plate 200 relative to the bottom plate 200. The connector 450 fixed on the second rack 430 therefore moves along the same direction as the second rack 430, such that the box 300 is lowered back to the bottom plate 200.

Figure 5:
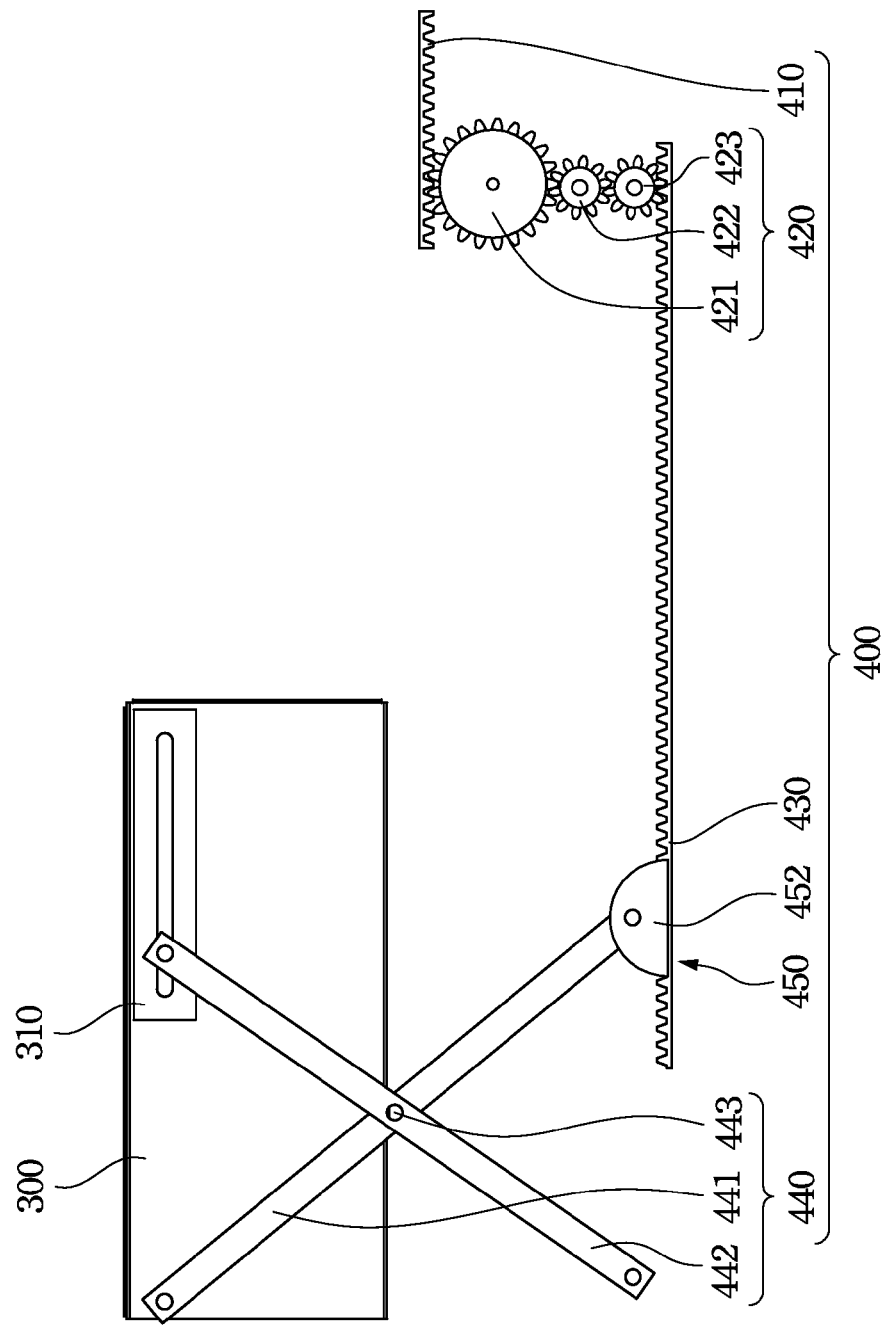
FIG. 5 is a side view of the lifting device and the box according to another embodiment of the present invention.

FIG. 5 is a side view of the lifting device 400 and the box 300 according to another embodiment of the present invention. In one or more embodiments, the gear number of the gear group 420 may be a plural and odd number. As shown in FIG. 5, the gear group 420 includes a first gear 421, a second gear 422, and a third gear 423, where the first gear 421 is coupled to the first rack 410, and the third gear 423 is coupled to the second rack 430. When the bottom plate 200 is pulled out of the casing 100, as shown in FIG. 3, the first gear 421 rotates clockwise, the second gear 422 rotates counterclockwise, and the third gear 423 rotates clockwise, and therefore the second rack 430 moves toward the moving direction of the bottom plate 200 relative to the bottom plate 200. More specifically, as long as the gear number of the gear group 420 is odd, the moving directions of the lifting device 400 will be the same when the bottom plate 200 is moved out of or into the casing 100. On the other hand, the sizes of the second gear 422 and the third gear 423 may be smaller than the first gear 421 for saving power. It should be understood that the gear number and the gear sizes of the gear group 420 are illustrative only and should not limit the scope of the claimed invention. The person having ordinary skill in the art may design the gear number and the gear sizes of the gear group 420 according to actual requirements.

In summary, the drawer lifting device according to one embodiment of the present invention is provided. For the drawer lifting device, the box 300 disposed on the bottom plate 200 is lifted by the lifting device 400 when the bottom plate 200 is pulled out of the casing 100, and the box 300 is back to its original position when the bottom plate 200 is pushed into the casing 100. Therefore, for a drawer whose position is lower than a user's hands, the box 300 disposed on the bottom plate 200 can be lifted to a position that the user can reach for convenience when the bottom plate 200 is moved out of the casing 100.

Figure 6:
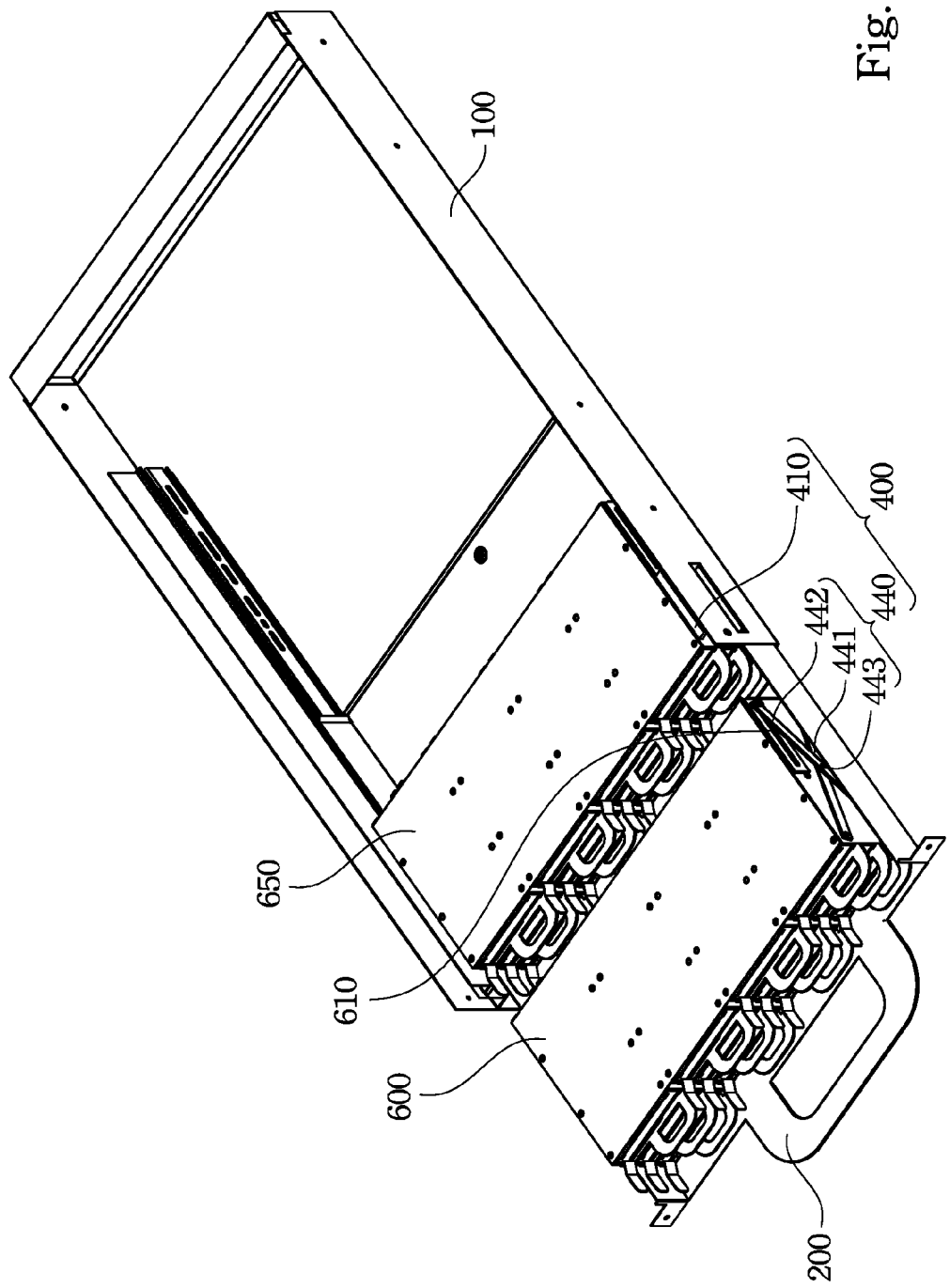
FIG. 6 is a schematic diagram of a server when it is not moved out completely according to one embodiment of the present invention.
Figure 7:
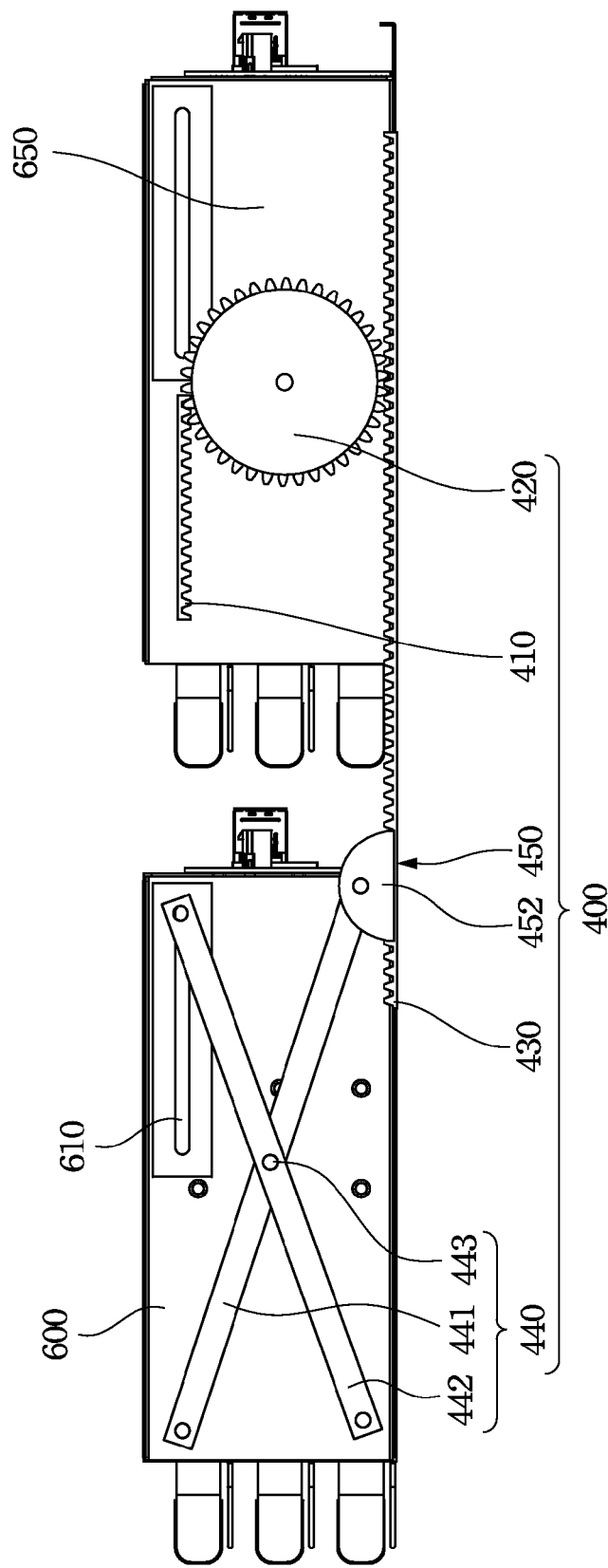
FIG. 7 is a side view of the lifting device, the first hard disk module, and the second hard disk module in FIG. 6.

FIG. 6 is a schematic diagram of a server when it is not moved out completely according to one embodiment of the present invention. FIG. 7 is a side view of the lifting device 400, the first hard disk module 600, and the second hard disk module 650 in FIG. 6. The server includes a casing 100, a bottom plate 200, a first hard disk module 600, a second hard disk module 650, and a lifting device 400. The bottom plate 200 is disposed in the casing 100 and utilized to be slid relative to the casing 100. In other words, the bottom plate 200 may be moved into or out of the casing 100 through a handle. The first hard disk module 600 includes a track 610. The first hard disk module 600 is movable and disposed on the bottom plate 200. That is, the first hard disk module 600 is disposed on the bottom plate 200 when the bottom plate 200 is not moved out of the casing 100, and the first hard disk module 600 is moved relative to the bottom plate 200 when the bottom plate 200 is moved out of the casing 100. The second hard disk module 650 is fixed on the bottom plate 200, and disposed behind the first hard disk module 600. The lifting device 400 is disposed in a side gap between the bottom plate 200 and the casing 100 for lifting the first hard disk module 600 relative to the bottom plate 200 when the bottom plate 200 is moved out of or into the casing 100. In one or more embodiments, the number of the lifting device 400 may be one or plural. The person having ordinary skill in the art may design the number of the lifting device 400 according to actual requirements.

The lifting device 400 includes a first rack 410, a gear group 420, a second rack 430, a connector 450, and a shaft module 440. The first rack 410 is fixed on the casing 100. The gear group 420 is fixed on the second hard disk module 650 and coupled to the first rack 410. In one or more embodiments, the gear number of the gear group 420 may be one. The second rack 430 is fixed on the bottom plate 200 and coupled to the gear group 420. The connector 450 is pivotally connected to the shaft module 440, and the connector 450 may be a pivot block 452. The pivot block 452 is fixed on the second rack 430 and moves horizontally when the second rack 420 moves (details are in following).

The shaft module 440 includes a first shaft 441 and a second shaft 442. The two terminals of the first shaft 441 are pivotally connected to the connector 450 and the first hard disk module 600, respectively, and the two terminals of the second shaft 442 are pivotally connected to the track 610 and the bottom plate 200, respectively. The first shaft 441 and the second shaft 442 may be disposed across, and a cross point of the first shaft 441 and the second shaft 442 is a pivot point 443. It should be understood that the foregoing setup of the first shaft 441 and the second shaft 442 are only examples, and the present disclosure is not limited to the foregoing setup. The person having ordinary skill in the art may design the setup of the first shaft 441 and the second shaft 442 according to actual requirements.

Figure 8:
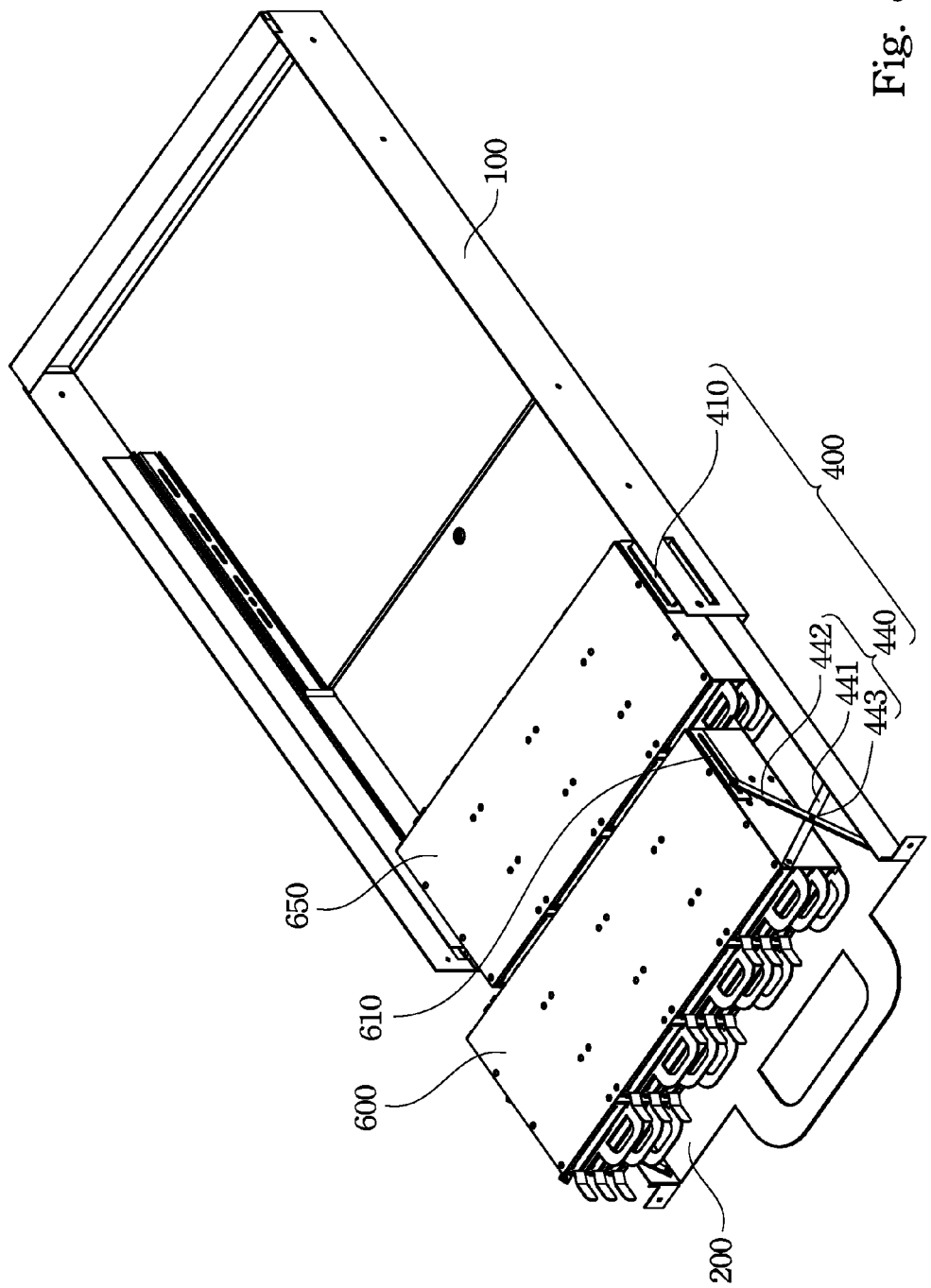
FIG. 8 is a schematic diagram of a server when it is moved out completely according to one embodiment of the present invention.
Figure 9:
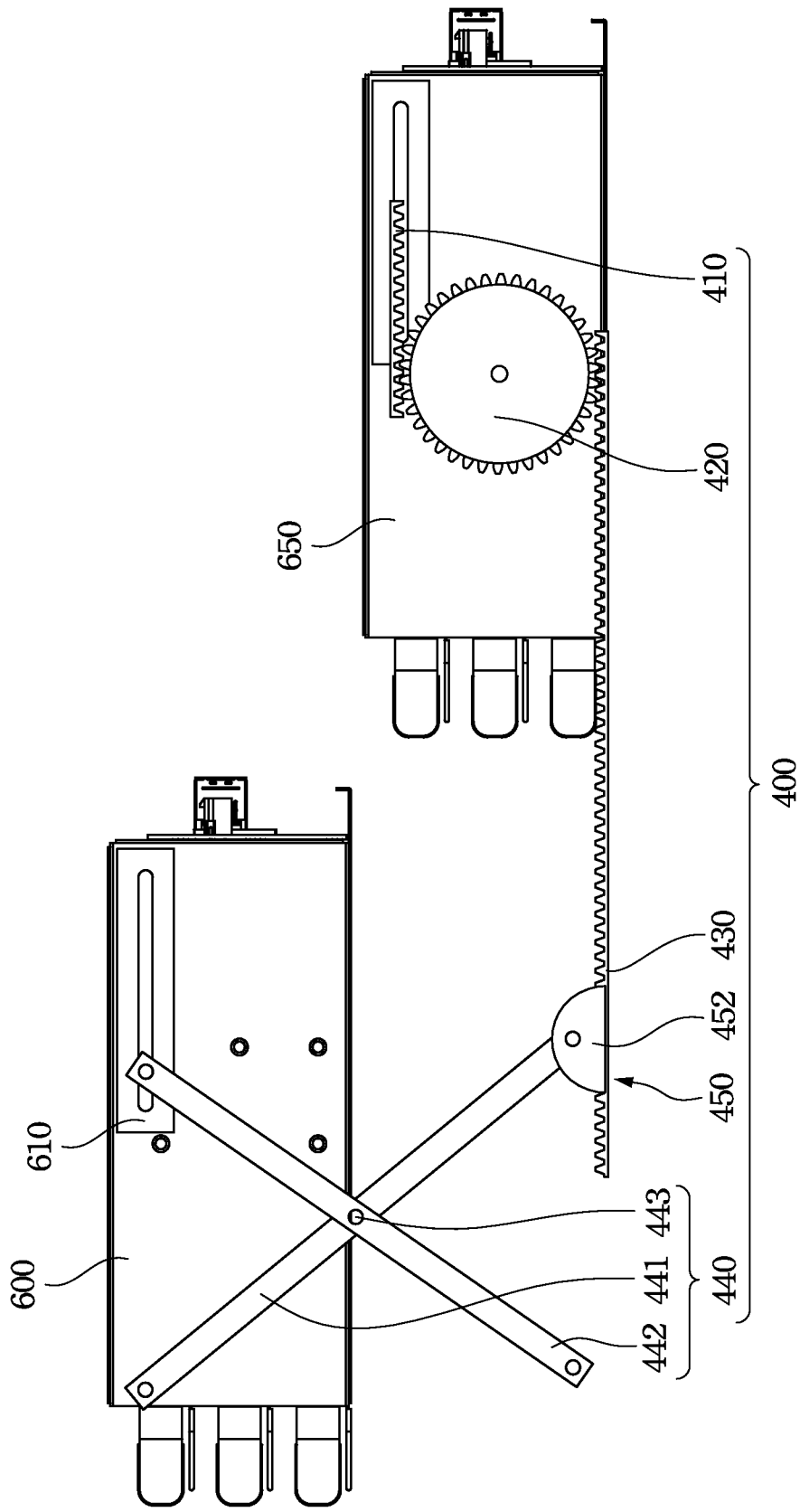
FIG. 9 is a side view of the lifting device, the first hard disk module, and the second hard disk module in FIG. 8.

FIG. 8 is a schematic diagram of a server when it is moved out completely according to one embodiment of the present invention. FIG. 9 is a side view of the lifting device 400, the first hard disk module 600, and the second hard disk module 650 in FIG. 8. When the bottom plate 200 is moved out of the casing 100, the first rack 410 fixed in the casing 100 makes the gear group 420 rotate clockwise since the first rack 410 is coupled to the gear group 420 which is fixed on the bottom plate 200, and therefore the center of the gear group 420 moves toward the moving direction of the bottom plate 200 relative to the first rack 410. The gear group 420 rotating clockwise brings the second rack 430 coupled to the gear group 420 to move toward the moving direction of the bottom plate 200 relative to the bottom plate 200. The connector 450 fixed on the second rack 430 therefore moves toward the same direction as the second rack 430, and the first hard disk module 600 is lifted by the shaft module 440.

The first shaft 441 is moved with the connector 450 when the connector 450 moves toward the moving direction of the bottom plate 200. Since the other terminal of the first shaft 441 is pivotally connected to the first hard disk module 600, the first shaft 441 rotates clockwise around the connector 450 as a center. The rotating first shaft 441 brings the second shaft 442 through the pivot joint 443, such that the second shaft 442 rotates counterclockwise around a terminal pivotally connected to the bottom plate 200 as a center. The second shaft 442 and a terminal pivotally connected to the track 610 therefore slide along the track 610, such that the first hard disk module 600 is lifted by the shaft module 440. Thus, the second hard disk module 650 can be shown in front of the server when the bottom plate 200 is moved out of the casing 100 since the first hard disk module 600 is lifted by the lifting device 400, and the hard disks inside the second hard disk module 650 can be replaced more easily. In other words, it is still convenient to take out the hard disks even if the accommodating space of the server is increased.

In contrast, when the bottom plate 200 is moved into the casing 100, the center of the gear group 420 moves toward the moving direction of the bottom plate 200 relative to the first rack 410, such that the gear group 420 rotates counterclockwise. The gear group 420 rotating counterclockwise brings the second rack 430 to move toward the moving direction of the bottom plate 200 relative to the bottom plate 200. The connector 450 fixed on the second rack 430 therefore moves along the same direction as the second rack 430, such that the first hard disk module 600 is lowered back to the bottom plate 200.

Figure 10:
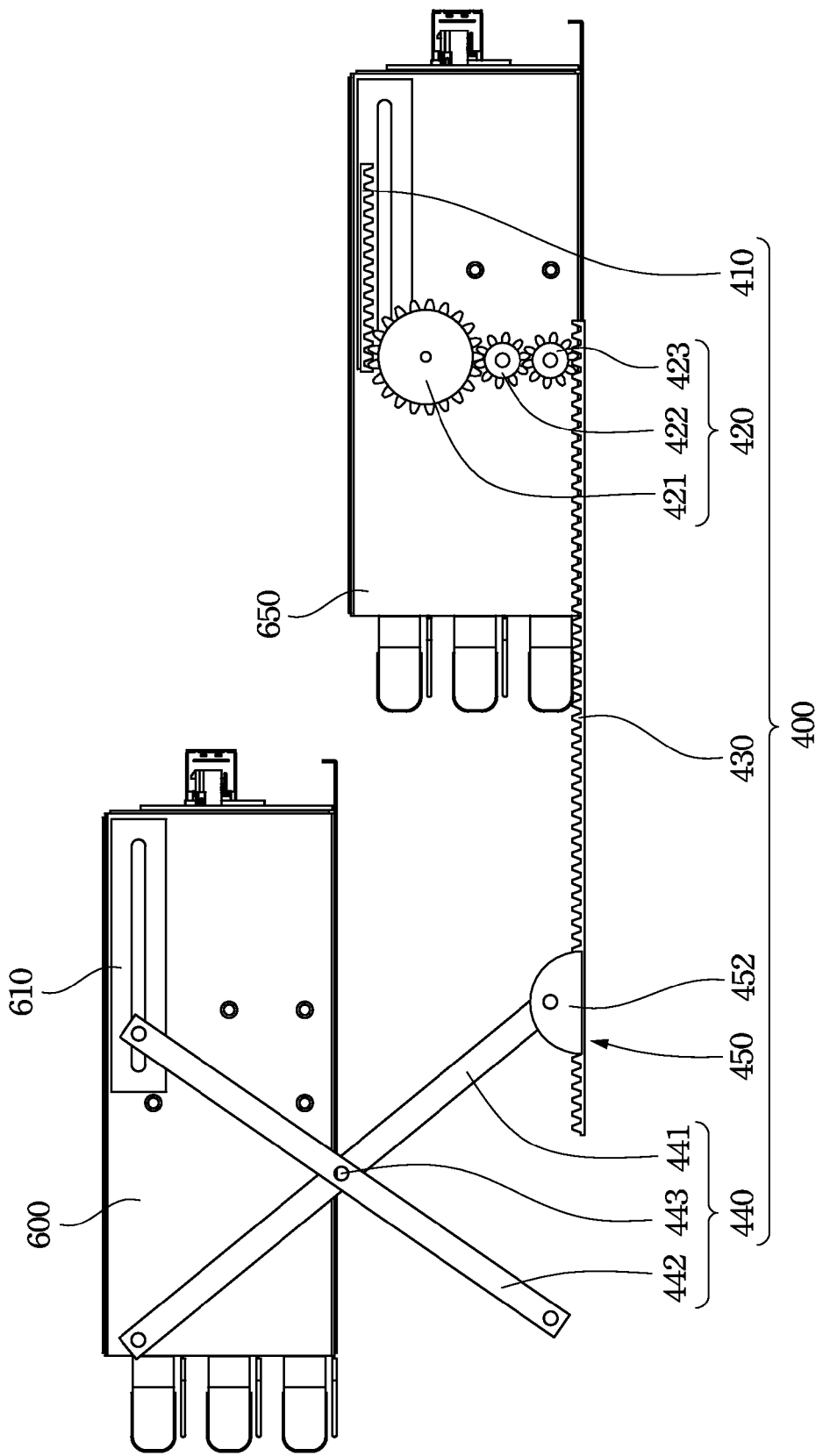
FIG. 10 is a side view of the lifting device, the first hard disk module, and the second hard disk module according to another embodiment of the present invention.

FIG. 10 is a side view of the lifting device 400, the first hard disk module 600, and the second hard disk module 650 according to another embodiment of the present invention. In one or more embodiments, the gear number of the gear group 420 may be a plural and odd number. As shown in FIG. 10, the gear group 420 includes a first gear 421, a second gear 422, and a third gear 423, where the first gear 421 is coupled to the first rack 410, and the third gear 423 is coupled to the second rack 430. When the bottom plate 200 is moved out of the casing 100, as shown in FIG. 8, the first gear 421 rotates clockwise, the second gear 422 rotates counterclockwise, and the third gear 423 rotates clockwise, and therefore the second rack 430 moves toward the moving direction of the bottom plate 200 relative to the bottom plate 200. More specifically, as long as the gear number of the gear group 420 is odd, the moving directions of the lifting device 400 will be the same when the bottom plate 200 is moved out of or into the casing 100. On the other hand, the sizes of the second gear 422 and the third gear 423 may be smaller than the first gear 421 for saving power. It should be understood that the gear number and the gear sizes of the gear group 420 are illustrative only and should not limit the scope of the claimed invention. The person having ordinary skill in the art may design the gear number and the gear sizes of the gear group 420 according to actual requirements.

In summary, the server according to one embodiment of the present invention is provided. For the server, since the first hard disk module 600 disposed on the bottom plate 200 is lifted by the lifting device 400 when the bottom plate 200 is pulled out of the casing 100, not only the hard disks put in the first hard disk module 600 but also the hard disks put in the second hard disk module 650 disposed behind the first hard disk module 600 can be taken out or put into the server from its front. In addition, the accommodating space of the server is increased as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A server, comprising:
a casing;
a bottom plate disposed in the casing and configured to slide relative to the casing;
a first hard disk module movably disposed on the bottom plate, the first hard disk module comprising a track;
a second hard disk module fixed on the bottom plate and disposed behind the first hard disk module; and
a lifting device for moving the first hard disk module up and down relative to the bottom plate, the lifting device comprising:
a first rack fixed on the casing adapted to be removably coupled from a gear group;
the gear group fixed on the second hard disk module and removably coupled to the first rack;
a second rack fixed on the bottom plate and coupled to the gear group;
a connector fixed on the second rack; and
a shaft module, comprising a first shaft and a second shaft, wherein two terminals of the first shaft are pivotally connected to the connector and the first hard disk module respectively, and two terminals of the second shaft are pivotally connected to the track and the bottom plate respectively,
whereby, when the bottom plate is pulled out of the casing, the first rack couples with the gear group to cause the first hard disk module to be moved up by the lifting device, and the first hard disk module is moved down to the bottom plate by the lifting device when the bottom plate is pushed into the casing as the first rack decouples with the gear group.

2. The server of claim 1, wherein the gear group comprises at least one gear, and the number of the gear is odd.

3. The server of claim 1, wherein the connector is a pivot block.

4. The server of claim 1, wherein the first shaft and the second shaft are disposed across, and a cross point of the first shaft and the second shaft is a pivot point.

5. A drawer lifting device, comprising:
a casing;
a bottom plate disposed in the casing and configured to slide relative to the casing;
a box movably disposed on the bottom plate, the box comprising a track; and
a lifting device for moving the box up and down relative to the bottom plate, the lifting device comprising:
a first rack fixed on the casing adapted to be removably coupled from a gear group;
the gear group fixed on the bottom plate and removably coupled to the first rack;
a second rack fixed on the bottom plate and coupled to the gear group;
a connector fixed on the second rack; and
a shaft module, comprising a first shaft and a second shaft, wherein two terminals of the first shaft are pivotally connected to the connector and the box respectively, and two terminals of the second shaft are pivotally connected to the track and the bottom plate respectively,
whereby, when the bottom plate is pulled out of the casing, the first rack decouples with the gear group to cause the box to be moved up by the lifting device, and the box is moved down to the bottom plate by the lifting device when the bottom plate is pushed into the casing as the first rack decouples with the gear group.

6. The drawer lifting device of claim 5, wherein the gear group comprises at least one gear, and the number of the gear is odd.

7. The drawer lifting device of claim 5, wherein the connector is a pivot block.

8. The drawer lifting device of claim 5, wherein the first shaft and the second shaft are disposed across, and a cross point of the first shaft and the second shaft is a pivot point.

9. A server, comprising:
a first hard disk module movably disposed on a bottom plate, the first hard disk module comprising a track; and
a lifting device for moving the first hard disk module up and down relative to the bottom plate, the lifting device comprising:
a first rack fixed on the casing adapted to be removably coupled from a gear group;
the gear group fixed on the second hard disk module and removably coupled to the first rack; and
a second rack fixed on the bottom plate and coupled to the gear group;
whereby, when the bottom plate is pulled out of a casing, the first rack couples with the gear group to cause the first hard disk module to be moved up by the lifting device, and the first hard disk module is moved down to the bottom plate by the lifting device when the bottom plate is pushed into the casing as the first rack decouples with the gear group.

10. The server of claim 9 further comprising a second hard disk module fixed on the bottom plate and disposed behind the first hard disk module.

11. The server of claim 9, further comprising a connector fixed on the second rack.

12. The server of claim 11, further comprising a shaft module comprising a first shaft and a second shaft, wherein the first shaft is pivotally coupled to the connector and the first hard disk module, and the second shaft is pivotally coupled to the track and the bottom plate.

13. The server of claim 9, wherein the first hard disk module comprises at least one hard disk drive.

14. The server of claim 10, wherein the second hard disk module comprises at least one hard disk drive.

15. The server of claim 11, wherein the connector is a pivot block.

16. The server of claim 12, wherein the first shaft and the second shaft are disposed across, and a cross point of the first shaft and the second shaft is a pivot point.

17. The server of claim 1, wherein the first hard disk module comprises at least one hard disk drive.

18. The server of claim 1, wherein the second hard disk module comprises at least one hard disk drive.

19. The server of claim 1, wherein the connector comprises a pivot block.

20. The server of claim 5, wherein the box comprises at least one hard disk drive.

* * * * *